(12) United States Patent
Kronmueller et al.

(10) Patent No.: US 9,207,696 B1
(45) Date of Patent: Dec. 8, 2015

(54) ROBUST SINK / SOURCE OUTPUT STAGE AND CONTROL CIRCUIT

(71) Applicant: Dialog Semiconductor GmbH, Kirchheim/Teck-Nabern (DE)

(72) Inventors: Frank Kronmueller, Neudenau (DE); Ambreesh Bhattad, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 14/547,264

(22) Filed: Nov. 19, 2014

(30) Foreign Application Priority Data

Jun. 26, 2014 (EP) .................................... 14174395

(51) Int. Cl.
G05F 1/56 (2006.01)

(52) U.S. Cl.
CPC ........................................ G05F 1/56 (2013.01)

(58) Field of Classification Search
USPC ............................ 323/313–316; 327/538–543
See application file for complete search history.

(56) References Cited

U.S. PATENT DOCUMENTS

| | | | | |
|---|---|---|---|---|
| 3,619,798 | A * | 11/1971 | Smith et al. ......................... 330/9 |
| 4,570,128 | A * | 2/1986 | Monticelli ..................... 330/267 |
| 4,584,520 | A * | 4/1986 | Vinn ............................... 323/316 |
| 4,613,810 | A | 9/1986 | Jablonski et al. |
| 5,027,053 | A | 6/1991 | Ohri et al. |
| 5,497,074 | A * | 3/1996 | Boezen ......................... 323/316 |
| 5,804,958 | A * | 9/1998 | Tsui et al. ..................... 323/313 |
| 6,201,375 | B1 * | 3/2001 | Larson et al. ................. 323/277 |
| 6,346,804 | B2 * | 2/2002 | Ueno et al. .................... 323/315 |
| 6,642,778 | B2 * | 11/2003 | Opris ............................. 327/539 |
| 2005/0001605 | A1 * | 1/2005 | Marinca ........................ 323/314 |
| 2005/0040804 | A1 | 2/2005 | Hashimoto et al. |
| 2006/0066390 | A1 * | 3/2006 | Shi et al. ........................ 327/538 |
| 2007/0030054 | A1 | 2/2007 | Lee et al. |
| 2010/0289465 | A1 * | 11/2010 | Elran ............................. 323/281 |
| 2012/0146595 | A1 * | 6/2012 | Wong ............................. 323/265 |
| 2012/0205978 | A1 * | 8/2012 | Wong ............................. 307/31 |

(Continued)

FOREIGN PATENT DOCUMENTS

EP 14174395.5-1810 4/2015

OTHER PUBLICATIONS

"Compact Low-Voltage Power-Efficient Operational Amplifier Cells for VLSI," by Klaas-Jan De Langen, et al., IEEE Journal of Solid-State Circuits, vol. 33, No. 10, Oct. 1998, pp. 1482-1496.

*Primary Examiner* — Timothy J Dole
*Assistant Examiner* — Yusef Ahmed
(74) *Attorney, Agent, or Firm* — Saile Ackerman LLC; Stephen B. Ackerman

(57) ABSTRACT

Multi-stage amplifiers, such as linear regulators, configured to provide a constant output voltage subject to load transients, are described. The multi-stage amplifier includes a first amplification stage which activates or deactivates a first output stage in response to an input voltage at an input node. The first output stage is configured to source a current at an output node of the multi-stage amplifier from a high potential, when activated. Furthermore, the multi-stage amplifier includes a second amplification stage configured to activate or to deactivate a second output stage in response to the input voltage at the input node. The second output stage is configured to sink a current at the output node of the multi-stage amplifier to a low potential, when activated. The first amplification stage and the second amplification stage are configured to activate the first output stage and the Second output stage in a mutually exclusive manner.

26 Claims, 7 Drawing Sheets

(56) References Cited

U.S. PATENT DOCUMENTS

2013/0314063 A1* 11/2013 Napravnik et al. ............ 323/273
2014/0084994 A1* 3/2014 Merkin et al. ................. 327/543
2014/0292402 A1* 10/2014 Nandy et al. ................... 329/312
2014/0375289 A1* 12/2014 Kronmueller et al. ......... 323/280
2015/0015331 A1* 1/2015 Kronmueller .................. 330/254
2015/0015332 A1* 1/2015 Kronmueller .................. 330/254

* cited by examiner

US 9,207,696 B1

ROBUST SINK / SOURCE OUTPUT STAGE AND CONTROL CIRCUIT

TECHNICAL FIELD

The present document relates to multi-stage amplifiers, such as linear regulators or linear voltage regulators (e.g. low-dropout regulators), configured to provide a constant output voltage subject to load transients.

BACKGROUND

An example of multi-stage amplifiers are low-dropout (LDO) regulators which are linear voltage regulators which can operate with small input-output differential voltages. A typical LDO regulator 100 is illustrated in FIG. 1a. The LDO regulator 100 comprises an output amplification stage 103, e.g. a field-effect transistor (FET), at the output and a differential amplification stage or differential amplifier 101 (also referred to as error amplifier) at the input. A first input (fb) 107 of the differential amplifier 101 receives a fraction of the output voltage $V_{out}$ determined by the voltage divider 104 comprising resistors R0 and R1. The second input (ref) to the differential amplifier 101 is a stable voltage reference $V_{ref}$ 108 (also referred to as the bandgap reference). If the output voltage $V_{out}$ changes relative to the reference voltage $V_{ref}$, the drive voltage to the output amplification stage, e.g. the power FET, changes by a feedback mechanism called main feedback loop to maintain a constant output voltage $V_{out}$.

The LDO regulator 100 of FIG. 1a further comprises an additional intermediate amplification stage 102 configured to amplify the output voltage of the differential amplification stage 101. As such, an intermediate amplification stage 102 may be used to provide an additional gain within the amplification path. Furthermore, the intermediate amplification stage 102 may provide a phase inversion.

In addition, the LDO regulator 100 may comprise an output capacitance $C_{out}$ (also referred to as output capacitor or stabilization capacitor or bypass capacitor) 105 parallel to the load 106. The output capacitor 105 is used to stabilize the output voltage $V_{out}$ subject to a change of the load 106, in particular subject to a change of the load current $I_{load}$. It should be noted that typically the output current $I_{out}$ at the output of the output amplification stage 103 corresponds to the load current $I_{load}$ through the load 106 of the regulator 100 (apart from typically minor currents through the voltage divider 104 and the output capacitance 105). Consequently, the terms output current $I_{out}$ and load current $I_{load}$ are used synonymously, if not specified otherwise.

Typically, it is desirable to provide a stable output voltage $V_{out}$, even subject to (positive or negative) transients of the load 106. By way of example, the regulator 100 may be used to provide a stable output voltage $V_{out}$ to the processor of an electronic device (such as a smartphone). The load current $I_{load}$ may vary significantly between a sleep state and an active state of the processor, thereby varying the load 106 of the regulator 100. In order to ensure a reliable operation of the processor, the output voltage $V_{out}$ should remain stable, even in response to such load transients. In particular, overvoltage and/or undervoltage situations of the output voltage $V_{out}$ should be avoided.

At the same time, the LDO regulator 100 should be able to react rapidly to load transients, i.e. the LDO regulator 100 should be able to rapidly provide the requested load current $I_{load}$, subject to a load transient. This means that the LDO regulator 100 should exhibit a high bandwidth.

SUMMARY

The regulator 100 shown in FIG. 1a is an example of a multi-stage amplifier. The present document is directed at providing power efficient multi-stage amplifiers which exhibit a high response speed, subject to positive and negative load transients. According to an aspect, a multi-stage amplifier, such as a linear regulator, is described. The multi-stage amplifier may comprise a plurality of amplification stages. In particular, the multi-stage amplifier comprises a first amplification stage which is configured to activate or to deactivate a first output stage of the multi-stage amplifier in response to an input voltage at an input node. Furthermore, the multi-stage amplifier comprises a second amplification stage which is configured to activate or to deactivate a second output stage in response to the input voltage at the input node. As such, the first amplification stage and the second amplification stage share the same input node. In particular, the first amplification stage and the second amplification stage may be part of two parallel branches of the multi-stage amplifier which lead from the input node to the output node.

The first and second amplification stages may also be referred to as a first and a second intermediate amplification stages, respectively, because the multi-stage amplifier typically comprises one or more amplification stages (e.g. a differential amplification stage) upstream of the input node, i.e. upstream of the first and the second amplification stages. The input mode may correspond to an output of the one or more amplification stages upstream of the input node.

Furthermore, the multi-stage amplifier comprises the first output stage which is configured to source a current at an output node of the multi-stage amplifier from a high potential (e.g. from a supply voltage), when the first output stage is activated. In addition, the multi-stage amplifier comprises the second output stage which is configured to sink a current at the output node of the multi-stage amplifier to a low potential (e.g. to ground), when the second output stage is activated.

The first amplification stage and the second amplification stage are configured to activate the first output stage and the second output stage in a mutually exclusive manner. In particular, the first and second amplification stages may ensure that (apart from an optional maintenance current) either the first output stage is active to source a current to the output node, or the second output stage is active to sink a current to the output node. By doing this, the output voltage of the multi-stage amplifier at the output node may be stabilized, subject to load transients, in a fast and in an energy efficient manner.

In particular, the first amplification stage may be configured to activate the first output stage, if the input voltage is at or below a pre-determined first threshold voltage. An input voltage which is at or below the pre-determined first threshold voltage may be an indication for an undervoltage situation of the output voltage at the output node. Furthermore, the second amplification stage may be configured to activate the second output stage, if the input voltage is at or above a pre-determined second threshold voltage. An input voltage which is at or above the pre-determined second threshold voltage may be an indication for an overvoltage situation of the output voltage at the output node. The second threshold voltage may be equal to or greater than the first threshold voltage. Hence, a current may be sourced at the output node to counter an undervoltage situation (subject to a positive load transient)

and a current may be sunk at the output node to counter an overvoltage situation (subject to a negative load transient).

The first amplification stage and the first output stage may form a first branch of the multi-stage amplifier from the input node to the output node, and the second amplification stage and the second output stage may form a second branch of the multi-stage amplifier from the input node to the output node. The first branch and the second branch may be implemented in a complimentary manner, in order to ensure that the first and the second branches are active in a mutually exclusive manner.

It should be noted that the term active may be understood as being operated to source or to sink a current which is equal to or greater than a pre-determined current threshold. The pre-determined current threshold may correspond to a maintenance current, which may be maintained within the first and/or the second output stage, in order to decrease the response time for the activation of the first and/or the second output stage.

The first amplification stage may comprise a first current source which is configured to provide a first current. Furthermore, the first amplification stage may comprise a first input transistor (e.g. a first N-type metal oxide semiconductor, MOS, transistor) which is arranged in series with the first current source. A gate of the first input transistor may be (directly) coupled to the input node. Hence, a level of the drain-source current through the first input transistor may be controlled by the input voltage at the input node. The first amplification stage may be configured to control a voltage level at a first midpoint between the first current source and the first input transistor, subject to the input voltage at the input node. The first output stage (notably the gate of a first control transistor of the first output stage) may be (directly) coupled to the first midpoint. By controlling the voltage level at the first midpoint, the first output stage may be activated or deactivated.

In an analogous manner, the second amplification stage may comprise a second current source which is configured to provide a second current. Furthermore, the second amplification stage may comprise a second input transistor (e.g. an N-type MOS transistor) which is arranged in series with the second current source. A gate of the second input transistor may be (directly) coupled to the input node. The second amplification stage may be configured to control a voltage level at a second midpoint between the second current source and the second input transistor, subject to the input voltage at the input node. The second output stage (notably a gate of a second control transistor of the second output stage) may be (directly) coupled to the second midpoint. By controlling the voltage level at the second midpoint, the second output stage may be activated or deactivated.

The first current source may be (directly) coupled to the high potential, a drain of the first input transistor may be (directly) coupled to the first midpoint, and a source of the first input transistor may be (directly) coupled to the low potential. As such, the voltage level at the first midpoint may vary between the high potential and the low potential, depending on the input voltage at the input node. A first midpoint at high potential may activate the first output stage and a first midpoint at low potential may deactivate the first output stage.

In a similar manner, the second current source may be (directly) coupled to the high potential, a drain of the second input transistor may be (directly) coupled to the second midpoint and a source of the second input transistor may be (directly) coupled to the low potential. Consequently, the voltage level at the second midpoint may vary between the high potential and the low potential, depending on the input voltage at the input node. A second midpoint at high potential may deactivate the first output stage and a second midpoint at low potential may activate the first output stage. The second amplification stage may be arranged in parallel to the first amplification stage.

The first amplification stage and the second amplification stage may be arranged to have different operating points. For this purpose, the first current and the second current may differ from one another. In particular, the second current may be smaller than the first current. Alternatively or in addition, the size of the first input transistor may differ from the size of the second transistor. By changing the current and/or the size of the first and/or second amplification stages, the input voltage (i.e. the first threshold voltage) at which the first midpoint goes high (to active the first output stage) and the input voltage (i.e. the second threshold voltage) at which the second midpoint goes low (to activate the second output stage) may be defined. By doing this, the dead band between sourcing of current and sinking of current may be defined.

As indicated above, the second current source may be coupled to the high potential and the drain of the second input transistor may be coupled to the second midpoint. Furthermore, the source of the second input transistor may be coupled to the first midpoint. By doing this, it may be ensured that the second amplification stage exhibits a current (i.e. a current through the second input transistor) only if the first input transistor is in on-state (i.e. if the first midpoint is low, thereby deactivating the first output stage). This is beneficial, as this allows reducing the power consumption of the multi-stage amplifier (by suppressing a current within the second amplification stage, when the first output stage is active).

The first input transistor may comprise a first partial transistor and a second partial transistor. The first partial transistor and the second partial transistor may be arranged in series, and a gate of the first partial transistor and a gate of the second partial transistor may be coupled to the input node. A source of the second input transistor may be (directly) coupled to a midpoint between the first partial transistor and the second partial transistor. By using partial transistors within the first amplification stage, the dead band between an active second output stage and an active first output stage may be reduced. Consequently, the reaction time of the multi-stage amplifier, subject to a negative load transient, may be reduced.

The first output stage may comprise a first control transistor having a gate which is (directly) coupled to the first intermediate stage (notably to the first midpoint of the first intermediate stage), and being configured to vary a first control current through the first control transistor, subject to a voltage level at the gate of the first control transistor. In particular, the first control current may be increased if the voltage level at the first midpoint is increased. Furthermore, the first output stage may comprise a first output amplifier which is configured to source an amplified version of the first control current to the output node. The first output amplifier may comprise a first current mirror with a first diode transistor and a first output transistor. The first diode transistor may be arranged in series with the first control transistor (e.g. such that the first diode transistor is traversed by the first control current). A drain of the first output transistor may be (directly) coupled to the output node, and the first output transistor may be traversed by the amplified version of the first control current, which is sourced at the output node.

In a similar and complementary manner, the second output stage may comprise a second control transistor having a gate which is (directly) coupled to the second amplification stage (notably to the second midpoint of the second amplification stage), and being configured to vary a second control current through the second control transistor, subject to a voltage level at the gate of the second control transistor. In particular, the second control current may increase if the voltage level at the second midpoint decreases. Furthermore, the second output stage may comprise a second output amplifier which is configured to sink an amplified version of the second control current at the output node. The second output amplifier may comprise a second current mirror with a second diode transistor and a second output transistor. The second diode transistor may be arranged in series with the second control transistor (e.g. such that the second diode transistor is traversed by the second control current). A drain of the second output transistor may be (directly) coupled to the output node. Furthermore, the second output transistor may be traversed by the amplified version of the second control current, which is sunk at the output node.

The first output transistor and the second output transistor may be arranged in series between the high potential and the low potential. The output node may correspond to a midpoint between the (drain of the) first output transistor and the (drain of the) second output transistor. A source of the first output transistor may be coupled to the high potential, and a source of the second output transistor may be coupled to the low potential. As such, by activating the first output stage, a current may be drawn from the high potential through the first output transistor, in order to provide an increased load current to a load which may be coupled to the output node. In a similar manner, a current may be sunk to the low potential via the second output transistor, in order to sink a superfluous current from the output node. As a result of this, the output voltage at the output node may be stabilized in an efficient manner.

In symmetry to the first and second output transistors, a source of the first diode transistor may be (directly) coupled to the high potential, a source of the first control transistor may be (directly) coupled to the low potential, a source of the second diode transistor may be (directly) coupled to the low potential, and a source of the second control transistor may be (directly) coupled to the high potential.

As indicated above, the first and second output stages may be implemented in a complementary manner, notably with respect to the type of transistors used and/or with respect to the potential to which the stage refers. In particular, the first control transistor may comprise (or may be) an N-type MOS transistor, and the first output amplifier may comprise P-type MOS transistors. Consequently, the second control transistor may comprise (or may be) a P-type MOS transistor, and the second output amplifier may comprise N-type MOS transistors.

As outlined above, the first and/or the second output stages may be provided with a maintenance current, in order to speed up the activation of the respective stage. For this purpose, the first output stage may comprise a first maintenance current source which is arranged in parallel to the first control transistor and which is configured to provide a first maintenance current to the first output amplifier. Alternatively or in addition, the second output stage may comprise a second maintenance current source which is arranged in parallel to the second control transistor and which is configured to provide a second maintenance current to the second output amplifier.

The multi-stage amplifier may comprise an auxiliary input transistor (e.g. an N-type MOS transistor). A gate of the auxiliary input transistor may be (directly) coupled to the input node, a drain of the auxiliary input transistor may be (directly) coupled to the output node and a source of the auxiliary input transistor may be (directly) coupled to the low potential. As such, the auxiliary input transistor may be used to sink current at the output node to the low potential. Hence, the auxiliary input transistor may be used to reduce the dead band between the sourcing of current and the sinking of current at the output node. For this purpose, an operating point of the auxiliary input transistor may be set relative to (e.g. may be matched with) an operating point of the first and/or second input transistors.

As indicated above, the multi-stage amplifier may comprise one or more further amplification stages. Furthermore, the multi-stage amplifier may comprise a feedback loop for regulating the output voltage. In particular, the multi-stage amplifier may comprise voltage sensing means (e.g. a voltage divider) which are configured to provide an indication of the output voltage at the output node. In addition, the multi-stage amplifier may comprise a differential amplification stage which is configured to provide the input voltage at the input node, based on a reference voltage and based on the indication of the output voltage at the output node. By doing this, the output voltage may be regulated in accordance to the reference voltage.

According to a further aspect, a method for stabilizing an output voltage at an output node of a multi-stage amplifier is described. The method may comprise activating or deactivating a first output stage of the multi-stage amplifier, in response to an input voltage at an input node using a first amplification stage. The input voltage at the input node may be dependent on (or may be derived from) the output voltage at the output node. Furthermore, the method may comprise activating or deactivating a second output stage in response to the input voltage at the input node using a second amplification stage. The first amplification stage and the second amplification stage may be configured to active the first output stage and the second output stage in a mutually exclusive manner. The method may comprise sourcing a current at the output node of the multi-stage amplifier from a high potential, by activating the first output stage, if the input voltage at the input node is indicative of an undervoltage situation at the output node. In addition, the method may comprise sinking a current at the output node of the multi-stage amplifier to a low potential, by activating the second output stage, if the input voltage at the input node is indicative of an overvoltage situation at the output node.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1A:
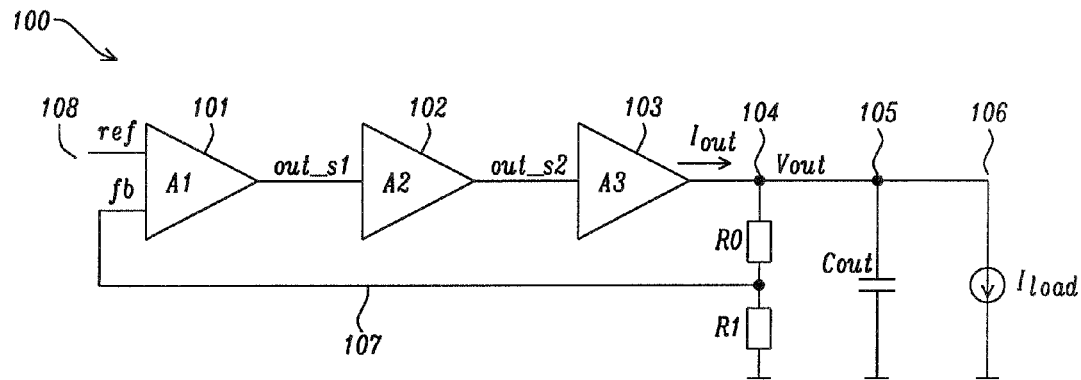
FIG. 1a illustrates an example block diagram of an LDO regulator.
Figure 1B:
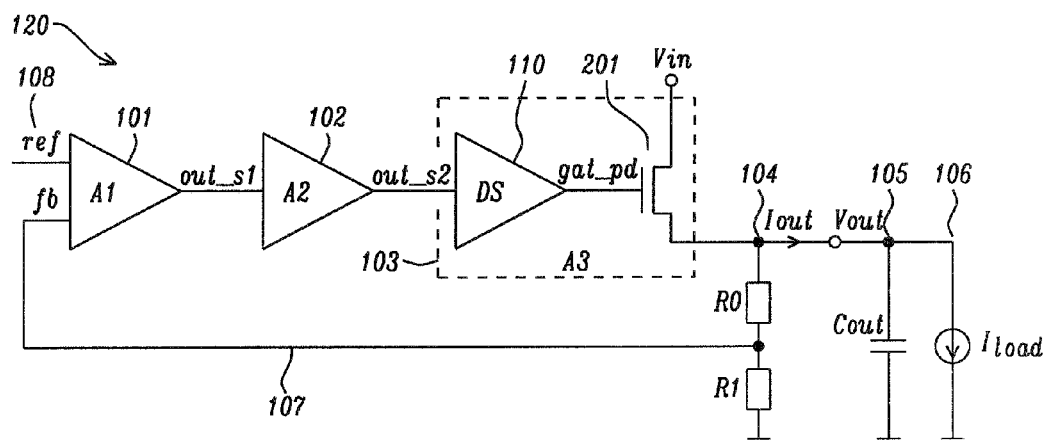
FIG. 1b illustrates the example block diagram of an LDO regulator in more detail.

As already outlined above, FIG. 1a shows an example block diagram for an LDO regulator 100 with its three amplification stages A1, A2, A3 (reference numerals 101, 102, 103, respectively). FIG. 1b illustrates the block diagram of a LDO regulator 120, to wherein the output amplification stage A3 (reference numeral 103) is depicted in more detail. In particular, the pass transistor 201 and the driver stage 110 of the output amplification stage 103 are shown. Typical parameters of an LDO regulator are a supply voltage of 3V, an output voltage of 2V, and an output current or load current ranging from 1 mA to 100 or 200 mA. Other configurations are possible. The present invention is described in the context of a linear regulator. It should be noted, however, that the present invention is applicable to multi-state amplifiers in general.

It is desirable to provide a multi-stage amplifier such as the regulator 100, 120, which is configured to generate a stable output voltage $V_{out}$ subject to load transients. The output capacitor 105 may be used to stabilize the output voltage $V_{out}$, because in case of a load transient, an additional load current $I_{load}$ may be provided by or may be sunk by the output capacitor 105. Furthermore, schemes such as Miller compensation and/or load current dependent compensation may be used to stabilize the output voltage $V_{out}$.

Figure 2:
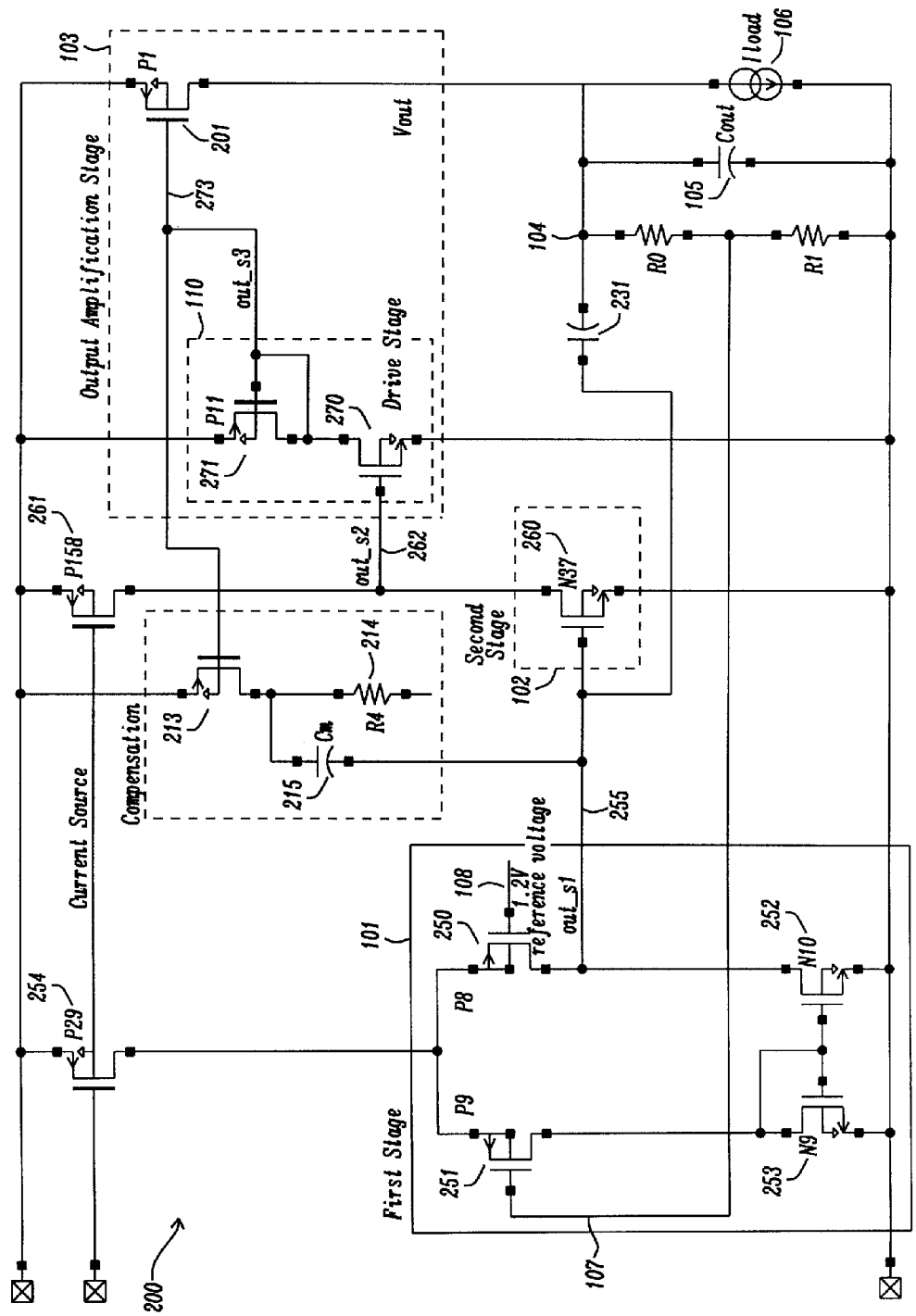
FIG. 2 shows an example circuit arrangement of an LDO regulator.

FIG. 2 illustrates an example circuit arrangement of an LDO regulator 200 comprising a Miller compensation using a capacitance $C_V$ 231 and a load current dependent compensation comprising a current mirror with transistors 201 (corresponding to the pass transistor 201) and 213, a compensation resistor 214 and a compensation capacitance $C_m$ 215.

The circuit implementation of FIG. 2 can be mapped to the block diagrams in FIGS. 1a and 1b, as similar components have received the same reference numerals. In the circuit arrangement 200, the differential amplification stage 101, the intermediate amplification stage 102 and the output amplification stage 103 are implemented using field effect transistors (FET), e.g. metal oxide semiconductor FETs (MOSFETs).

The differential amplification stage 101 comprises the differential input pair of transistors P9 251 and P8 250, and the current mirror N9 253 and N10 252. The input of the differential pair is e.g. a 1.2V reference voltage 108 at P8 and the feedback 107 at P9 which is derived from the resistive divider 104 (with e.g. R0=0.8 MΩ and R1=1.2 MΩ).

The intermediate amplification stage 102 comprises a transistor N37 260 (referred to herein as an input transistor), wherein the gate of transistor N37 260 is coupled to the stage output node 255 of the differential amplification stage 101 (also referred to as an input node of the intermediate amplification stage 102). The transistor P158 261 acts as a current source for the intermediate amplification stage 102, similar to transistor P29 254 which acts as a current source for the differential amplification stage 101.

The output amplification stage 103 is coupled to the stage output node 262 of the intermediate amplification stage 102 and comprises a pass device or pass transistor 201 (also referred to as an output transistor) and a gate driver stage 110 for the pass device 201, wherein the gate driver stage comprises a transistor 270 (also referred to as a control transistor) and a transistor P11 271 connected as a diode (also referred to as a diode transistor or as a transistor diode). This gate driver stage has essentially no gain since it is low-ohmic through the transistor diode P11 271 which yields a resistance of $1/g_m$ (output resistance of the driver stage 110 of the output amplification stage 103) to signal ground. The gate of the pass transistor 201 is identified in FIG. 2 with reference numeral 273. In the present document, means for stabilizing the output voltage of a multi-stage amplifier such as the regulator 200 are described. These means may be used in conjunction with other stabilizing means, such as an output capacitor 105, Miller compensation 231 and/or load current dependent compensation 213, 214, 215. The described stabilizing means are configured to increase the stability of the multi-stage amplifier 200 subject to load transients, and at the same time to allow for a fast convergence of the multi-stage amplifier 200 subject to such load transients. Furthermore, the described stabilizing means allow for the implementation of a power efficient multi-stage amplifier 200.

In particular, the described means allow for a combined AB operation of the multi-stage amplifier 200, i.e. the described means provide a multi-state amplifier 200 which is configured to operate in stable manner for positive load transients (when the load 106 increases) and for negative load transients (when the load 106 decreases). Even more particularly, an output stage of a multi-stage amplifier 200 is described which is configured to rapidly source current (for a positive load transient) and to rapidly sink current (for a negative load transient).

The multi-stage amplifier 200 may comprise a push-pull output stage which is working in so-called AB or B operation. The push-pull output stage may provide a linear (Class-AB) or slightly nonlinear (Class-B) output transfer function and may provide a drive capability on varying loads 106 and/or input or reference signals 108.

Figure 3:
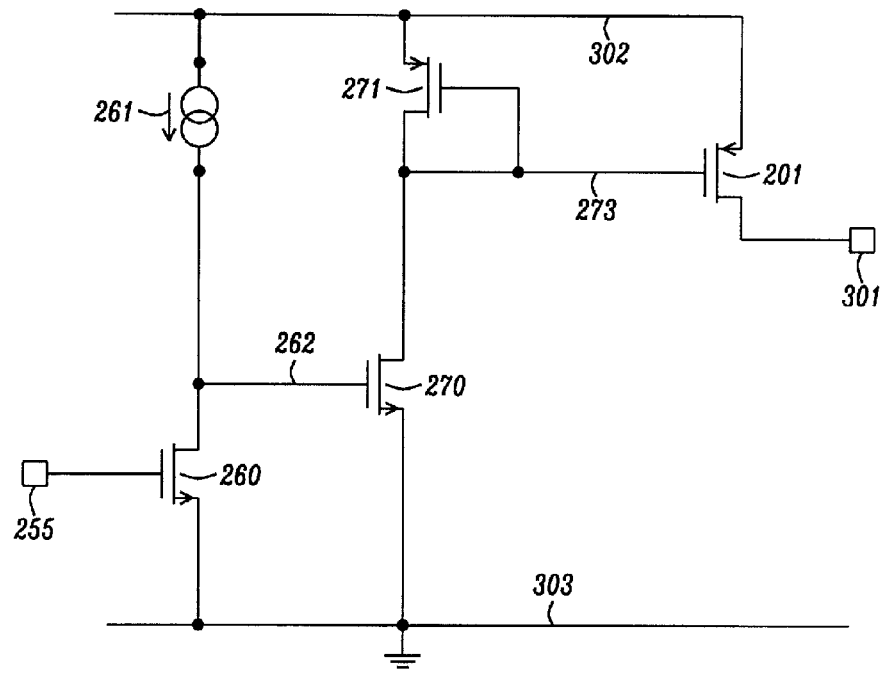
FIG. 3 shows an excerpt of the LDO regulator of FIG. 2.

The use of a push-pull output stage (comprising a first output stage which is coupled to the supply voltage and a second output stage which is coupled to ground) in conjunction with a multi-stage amplifier 200 such as an LDO may be difficult, due to relatively large gains of the multi-stage amplifier 200 and due to relatively high current ratios (~100) which are to-be-provided by the output stage. In this context, the intermediate stage and the output stage of an example multi-stage amplifier 200 are illustrated in FIG. 3. Possible mismatches of the bias control are typically translated into substantial currents in the output transistor 201 and may therefore lead to an increase of the power consumption of the multi-stage amplifier 200.

An example push-pull output stage may comprise an additional differential pair which forms a comparator or a linear amplifier and which is driving a sink device arranged in parallel to the multi-stage amplifier 200. The additional sink device may be used to sink a current from the output node 301 of the multi-state amplifier, when the differential pair is enabled by an overvoltage situation (subject to a negative transient). The use of an additional differential pair may lead to an increased mismatch and to an increase of a dead band between the A operation (for positive load transients) and the B operation (for negative load transients). Furthermore, the sink/source capability tends to be asymmetric and output voltage-dependent.

In the present document, the use of a complementary output stage (notably a linear output stage) is described. Furthermore, a robust control circuit which is configured to avoid overlapping operation is described. By doing this, stability of the multi-stage amplifier 200 can be ensured.

Figure 4A:
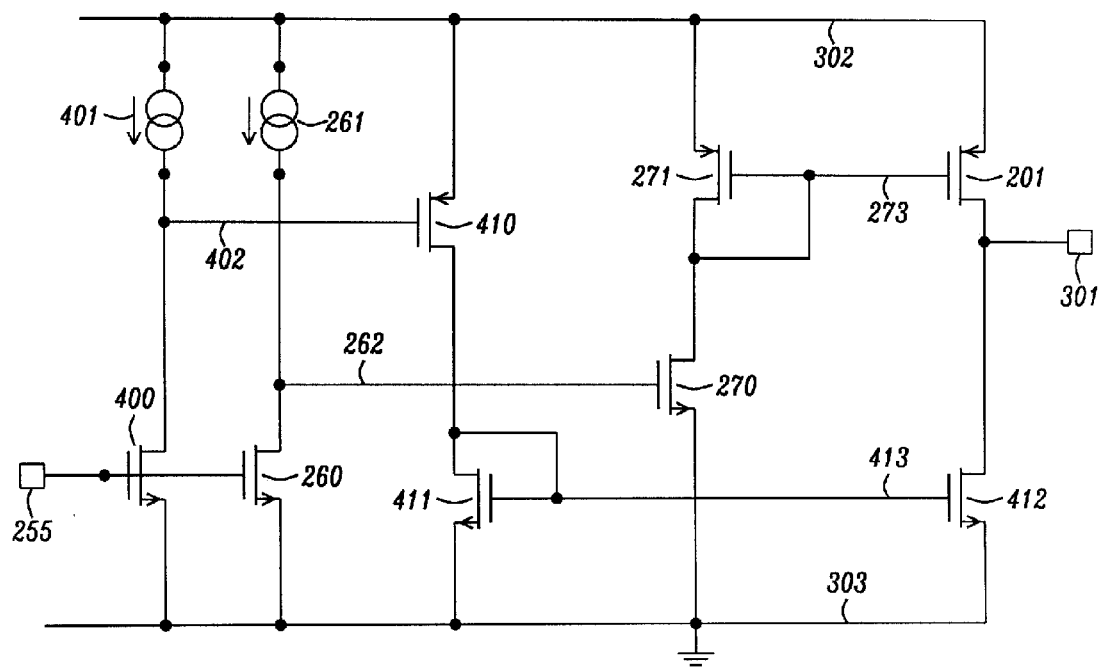
FIG. 4a to FIG. 4e show excerpts of LDO regulators comprising means for combined AB operation.

FIG. 4a illustrates the intermediate stage and the push-pull output stage of a multi-stage amplifier 200. The multi-stage amplifier 200 comprises a first output stage 270, 271, 201 which is configured to source current to the output node 301. Furthermore, the multi-stage amplifier 200 comprises a second output stage 410, 411, 412 which is configured to sink current at the output node 301. The first output stage and the second output stage may be arranged in parallel with respect to one another. The second output stage may be designed in a complimentary manner with respect to the first output stage. In particular, the first output stage may comprise a current mirror with PMOS transistors and the second output stage may comprise a current mirror with NMOS transistors.

The first output stage 270, 271, 201 is controlled using a first intermediate stage 260, 261 (also referred to as a first intermediate amplification stage or as a first amplification stage), and the second output stage 410, 411, 412 is controlled using a second intermediate stage 400, 401 (also referred to as a second intermediate amplification stage or as a second amplification stage). The first intermediate stage and the second intermediate stage may have different operating points. The different operating points may ensure that the first output stage and the second output stage do not operate concurrently, thereby causing an instable operation of the multi-stage amplifier 200.

By way of example, a second current source 401 of the second intermediate stage may provide a second current which is different from a first current provided by the first current source 261 of the first intermediate stage. As a result of this, the first midpoint 262 (between the first current source 401 and the first input transistor 400) of the first intermediate stage may be driven differently from the second midpoint 402 (between the second current source 261 and the second input transistor 260) of the second intermediate stage. Alternatively or in addition, the first input transistor 400 and the second input transistor 260 may have different sizes.

Subject to a positive load transient, the output voltage at the output node 301 drops causing an undervoltage situation. The output voltage is fed back to the input of the multi-stage amplifier 200 and leads to a drop of the input voltage at the input node 255. As a result of this, the gate 262 of the first control transistor 270 is driven high, thereby increasing the current through the first control transistor 270 (also referred to as the first control current). The increased current is mirrored to the first pass device 201 (also referred to as the first output transistor) using the first current mirror 271, 201 of the first output stage. Hence, the first output stage sources current to the output node 301 in an undervoltage situation.

At the same time, the second midpoint 402 (i.e. the gate of the second control transistor 410) is driven high, thereby closing the second control transistor 410 such that no current (also referred to as the second control current) is flowing through the second output transistor 412 of the second output stage. Hence, the second output stage does not sink current during an undervoltage situation.

Subject to a negative load transient, the output voltage at the output node 301 increases, thereby causing an overvoltage situation. The output voltage is fed back to the input of the multi-stage amplifier 200 and leads to an increase of the input voltage at the input node 255. As a result of this, the gate 402 of the second control transistor 410 is driven low, thereby increasing the current through the second control transistor 410. The increased current is mirrored to the second output transistor 412 using the second current mirror 411, 412 of the second output stage. Hence, the second output stage sinks current in an overvoltage situation.

Furthermore, the first midpoint 262 (i.e. the gate of the first control transistor 270) is driven low, thereby closing the first control transistor 270 such that no current is flowing through the first output transistor 201 of the first output stage. Hence, the first output stage does not source current during an overvoltage situation.

In other words, instead of adding Class B functionality into the output stage, a second intermediate stage is added to the first intermediate stage. Furthermore, a second (e.g. an Ndrive) output stage is added to provide sink currents at the output node 301. The transistors of the first output stage and of the second output stage may be coupled to the same supply voltage 302 (also referred to more generally as a high potential) and to the same ground potential 303 (also referred to more generally as a low potential, wherein the low potential is lower than the high potential). It should be noted however, that the transistors of the first output stage and of the second output stage may be coupled or connected to different supply voltages (i.e. to different high potentials).

Robust operation may be ensured by setting different operating points for the first output stage and for the second output stage. For this purpose, the second input transistor 400 may be designed to be smaller than the first input transistor 260. The operation of the first output stage may be regarded as "normal" (source mode) operation. Alternatively or in addition, the current ratio of the first current provided by the first current source 261 and the second current provided by the second current source 401 may be changed. In normal operation (in an undervoltage situation), the gate 262 of the first control transistor 270 may be in the range of ~0.5V and the current through the first input transistor 260 may be equal to the first current.

When the output node 301 is on overvoltage, the input node 255 is pulled high by preceding gain stages of the multi-stage amplifier 200 in order to stop the provision of current from the first output transistor 201. For this purpose, the gate 262 of the first control transistor 270 is pulled towards zero. If the input voltage at the input node 255 is sufficiently high to pull down the—previously disabled—gate 402 of the second control transistor 410, a current through the diode transistor 411 of the second current mirror is enabled. As a result of this, a sink current through the second output transistor 412 is enabled.

The appropriate design of the input transistors 260, 400 and of the current sources 261, 401 ensures that at any time only one of the two output stages is enabled. This operation mode may be referred to as a Class-B mode of operation, which exhibits a certain dead band in which both output stages are turned off. The width of the dead band may be substantially reduced by preceding gain stages of the multi-stage amplifier 200 (which are not shown in FIG. 4a) which control the voltage feedback 107.

Figure 4B:
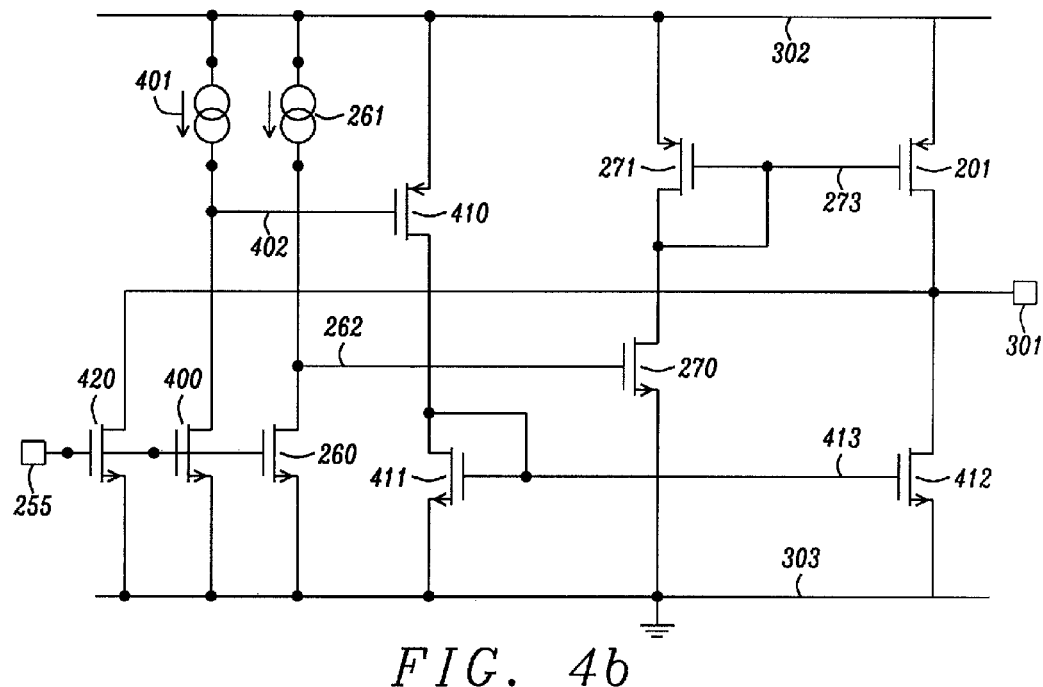

FIG. 4b shows complementary intermediate stages and output stages as described in the context of FIG. 4a. An additional input transistor 420 (also referred to as an auxiliary input transistor) is placed at the input node 255. The gate of the additional input transistor 420 may be coupled to the input node 255, and the drain of the additional input transistor 420 may be (directly) coupled to the output node 301. As a result of this, currents may be sunk within the dead band between sourcing of current using the first output stage 270, 271, 201 and sinking of current using the second output stage 410, 411, 412. The amount of current which may be sunk using the additional input transistor 420 depends on the size of the additional input transistor 420. The additional input transistor 420 may be matched with the first and/or second input transistors 260, 400. Consequently, the amount of current which is sunk using the additional input transistor 420 is lower than the sourced or sunk current using the first/second output stages by a factor which depends on (e.g. which corresponds to) the gain of the first/second intermediate stages and the first/second output stages.

Hence, by adding another input transistor 420 as shown in FIG. 4b and by connecting its drain to the output node 301 the Class-B output stage of FIG. 4a may be enhanced into a Class-AB output stage. By matching the additional input transistor 420 to the first input transistor 260 and/or the second input transistor 400, it may be ensured that the relatively low internal current is well controlled and small within the first output transistor 201 at zero load conditions.

Figure 4C:
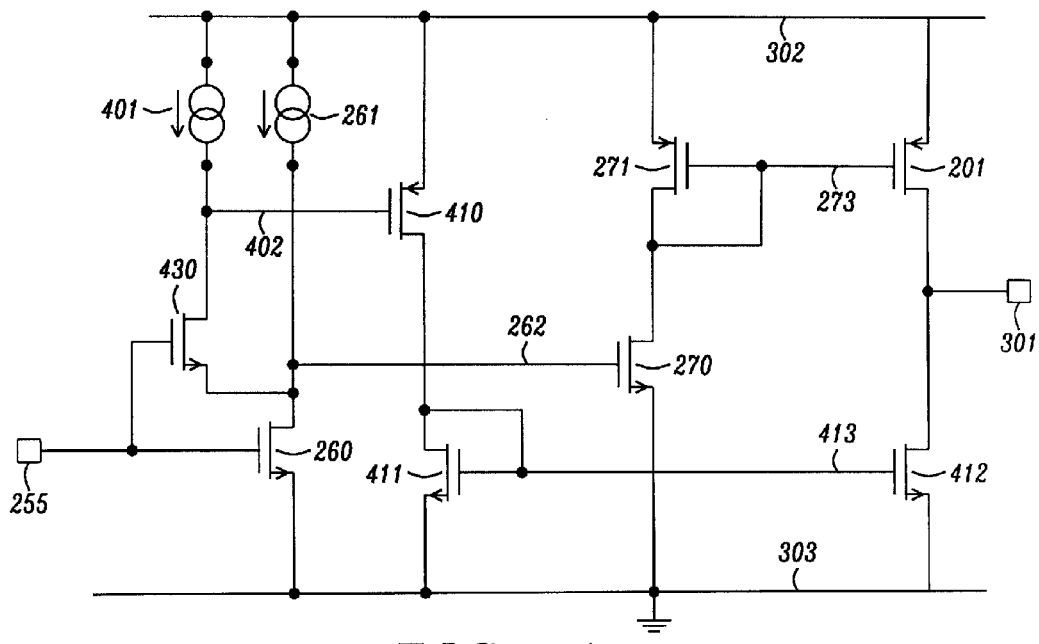

The use of a second parallel intermediate stage (and a second output stage) is associated with an additional current within the serial arrangement of the second current source 401 and the second input transistor 400. The additional current leads to an increased power consumption of the multi-stage amplifier 200. In order to reduce this current, the second intermediate stage may be arranged in a staggered manner with respect to the first intermediate stage. FIG. 4c shows an example implementation of the AB control which may be used to reduce the additional current.

As illustrated in FIG. 4c, the second input transistor 430 of the second intermediate stage may be arranged in series with the first input transistor 260. As a result of this, the current within the serial arrangement comprising the second current source 401 and the second input transistor 430 may be reduced.

In normal (undervoltage) mode, the first input transistor 260 is conducting the first current provided by the first current source 261 and the first control transistor 270 is under regulation. Therefore, a gate voltage of ~0.5V is present at the drain of the first input transistor 260. Since the second input transistor 430 has the same input voltage at its gate as the first input transistor 260, but has a source which is at a voltage level about ~0.5V higher than the source of the first input transistor 260, there is no current flow from the second current source 401 through the second input transistor 400 into the first input transistor 260. This means that in a normal operation mode, the second intermediate stage does not exhibit any current flow, thereby reducing the power consumption of the multi-stage amplifier 200 (compared to the implementation shown in FIG. 4a).

If an overvoltage occurs at the output node 301, the input voltage at the input node 255 is pulled high, and the gate voltage of the first control transistor 270 is subsequently pulled to ground. In other words, the voltage level at the source 262 of the first input transistor 260 is pulled to ground. This enables the second input transistor 430 to conduct current from the second current source 401. This enables the second control transistor 410 which then creates a sink current at the output node 301 via the second output transistor 412.

Figure 4D:
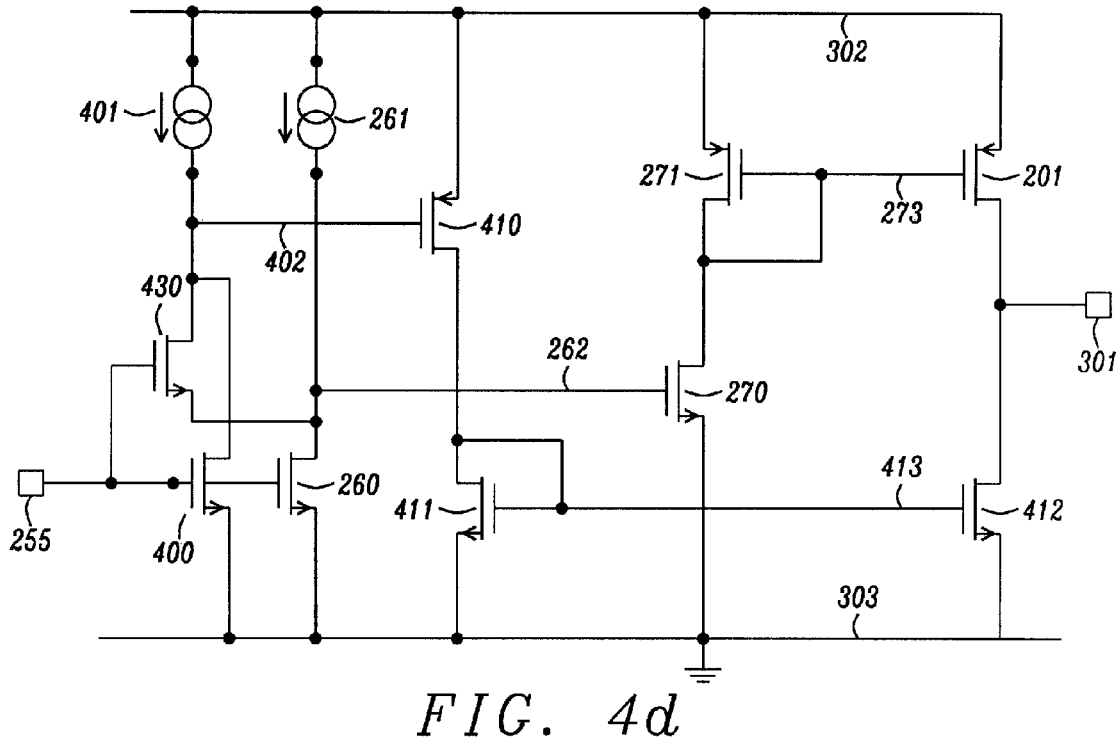

FIG. 4d shows a combination of the parallel AB control of FIG. 4a and the staggered AB control of FIG. 4c. The concurrent use of both schemes may be beneficial in order to provide a faster reaction to an overvoltage situation, while at the same time reducing the current within the second intermediate stage/second output stage during normal (i.e. undervoltage) operation.

Figure 4E:
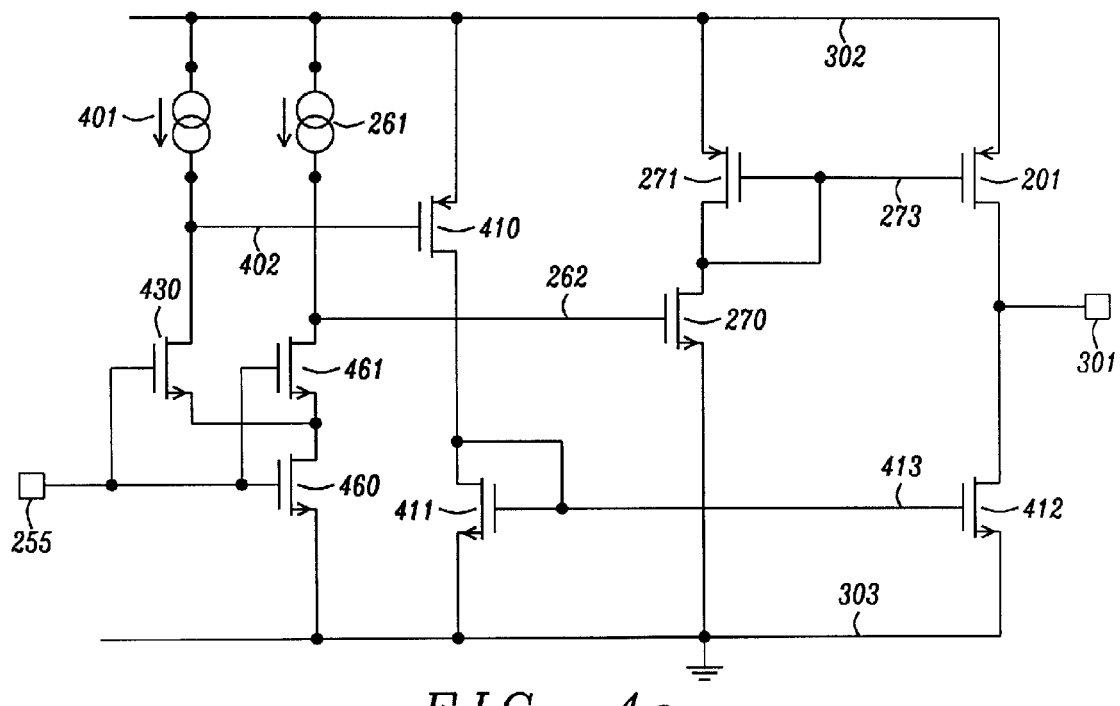

Another possibility for speeding up the transition from a Pdrive mode (where the first output stage is used to source current) to an Ndrive mode (where the second output stage is used to sink current) is the usage of a split-MOS as shown in FIG. 4e. The first input transistor 260 is split up into a first partial input transistor 460 and a second partial input transistor 461. The staggered second input transistor 430 may then be (directly) coupled to the source of the first partial input transistor 460 and to the drain of the second partial input transistor 461.

The tapped channel which is provided by the first and second partial input transistors 460, 461 lowers the threshold voltage which separates the operating points of the first and second intermediate stages and therefore allows for a faster transition (i.e. for a reduced dead band).

It should be noted that the above mentioned schemes may be combined with one another, in order to provide a fast and robust transition between the overvoltage operation mode and the undervoltage operation mode (and vice versa).

Figure 5A:
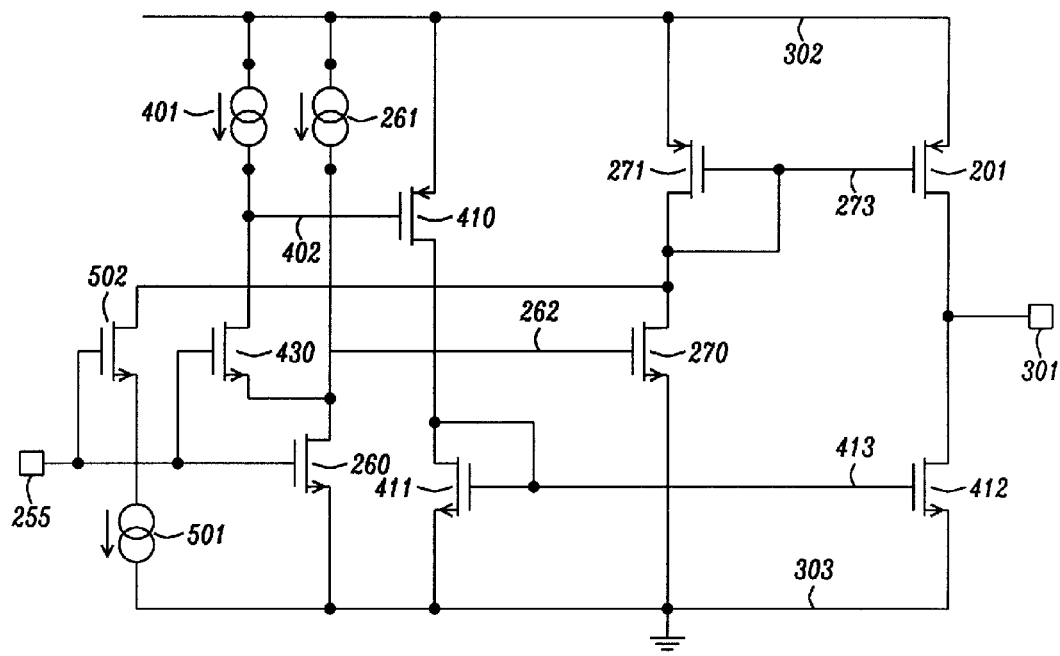
FIGS. 5a to 5b show excerpts of LDO regulators comprising means for an "always on" functionality.
Figure 5B:
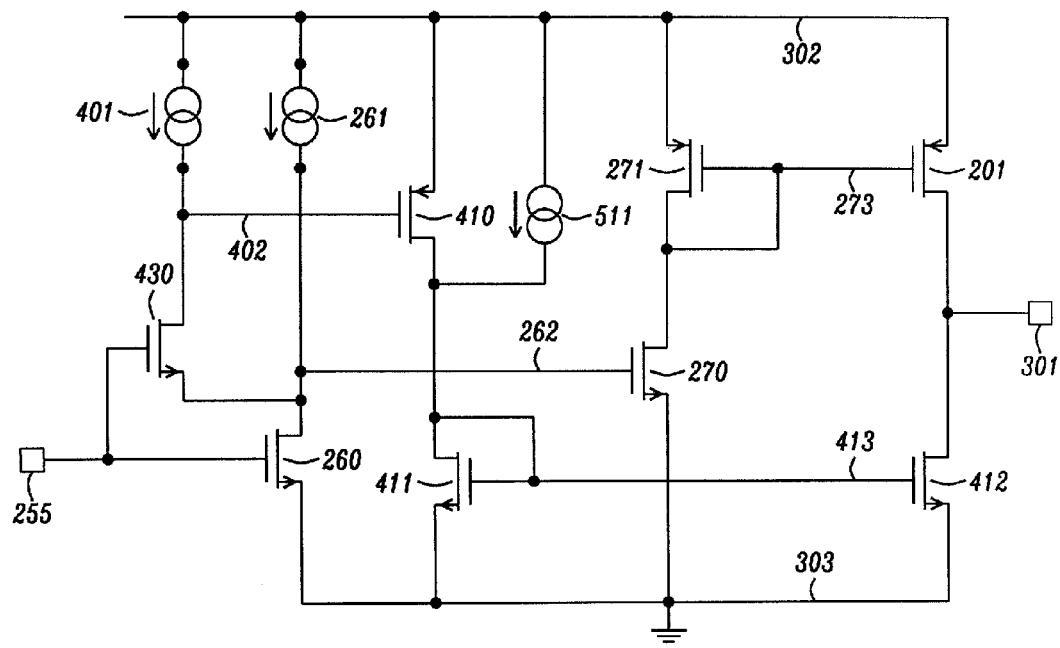

As outlined above, the first output stage is active and the second output stage is inactive in an undervoltage situation. In a similar manner, the first output stage is inactive and the second output stage is active in an overvoltage situation. The (full) activation of the first and/or second output stage may lead to reduced recovery/reaction times. FIGS. 5a and 5b illustrate means for reducing the recovery/reaction times of the multi-stage amplifier 200. For this purpose, the first and/or second output transistors 201, 412 may be held active to allow for fast reactions even when the respective output transistors are to be turned off by the regulation.

In particular, FIG. 5a shows means for maintaining the Pdrive 273 of the first output stage enabled during an overvoltage situation in order to ensure a fast recovery and reaction to sourcing load transients. When the overvoltage (i.e. the second output stage) is active, a first maintenance current may be injected to the Pdrive 273 using a first maintenance current source 501. A maintenance transistor 502 may be used to decouple the first maintenance current source 501 during normal operation, in order to preserve the operating point of the first output stage.

In a similar manner, a second maintenance current source 511 may be used to maintain the Ndrive 413 which is enabled during normal source condition in order to ensure a fast reaction on sinking load transients (see FIG. 5b). A fixed maintenance current provided by the second maintenance current source 511 may preserve the operation points of the transistors 411, 412 of the second current mirror and may provide a fixed load current to the output node 301.

The provision of a maintenance current in order to keep the first output stage and/or the second output stage enabled may be referred to as an "awake" state of the first and/or second output stage, which is different from an "active" state of the first and/or second output stage, wherein the first output stage sources current to counter an undervoltage situation and wherein the second output stage sinks current to counter an overvoltage situation. The "awake" state is independent of the input voltage at the input node 255. On the other hand, the "active" state is dependent on the input voltage at the input node 255.

The means for maintaining the first and/or second output stage "awake" may be used in combination with any of the other measures described in the present document.

It should be noted that all stability measures of the multi-stage amplifier 200 which are used to ensure stable operation of a higher level voltage regulation loop may also be reused for the sink mode operation. Either the Ndrive 413 or the Pdrive 273 path/branch closes the loop for the stability measures. In addition, it should be noted that the input control circuits (i.e. the intermediate stages) may be flipped, as the Ndrive 413 and Pdrive 273 are already symmetrical.

Figure 6:
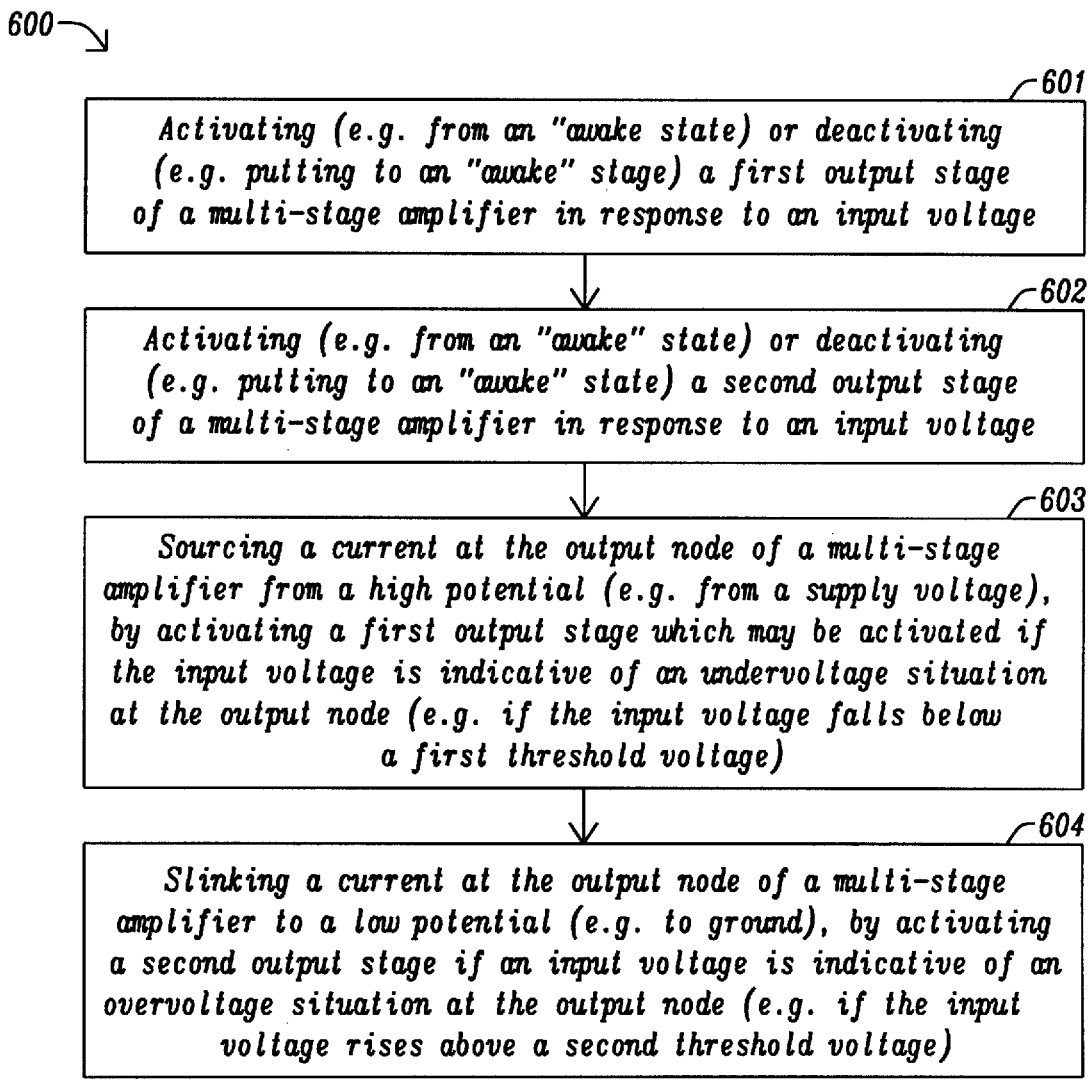
FIG. 6 shows a flow chart of an example method for controlling the output stage of a multi-stage amplifier.

FIG. 6 shows a flow chart of an example method 600 for stabilizing an output voltage at an output node 301 of a multi-stage amplifier 200. The method 600 comprises activating (e.g. from an "awake" state) or deactivating (e.g. putting to an "awake" state) 601 a first output stage 270, 271, 201 of the multi-stage amplifier 200, in response to an input voltage at an input node 255. The first output stage may be activated or deactivated using a first amplification stage 260, 261 (which is also referred to herein as the first intermediate stage). The input voltage at the input node 255 may be dependent on the output voltage at the output node 301. For this purpose, the multi-stage amplifier 200 may comprise a feedback loop for feeding back an indication of the output voltage at the output node 301 back to an input of the multi-stage amplifier 200.

Furthermore, the method 600 comprises activating (e.g. from an "awake" state) or deactivating (e.g. putting to an "awake" state) 602 a second output stage 410, 411, 412 of the multi-stage amplifier 200, in response to the input voltage at the input node 255. The second output stage may be activated or deactivated using a second amplification stage 400, 401 (also referred to herein as a second intermediate stage). The first amplification stage 260, 261 and the second amplification stage 400, 401 may be configured to activate the first output stage 270, 271, 201 and the second output stage 410, 411, 412 in a mutually exclusive manner.

In addition, the method 600 may comprise sourcing 603 a current at the output node 301 of the multi-stage amplifier 200 from a high potential 302 (e.g. from a supply voltage), by activating the first output stage 270, 271, 201. The first output stage may be activated if the input voltage at the input node 255 is indicative of an undervoltage situation at the output node 301 (e.g. if the input voltage falls below a first threshold voltage). Furthermore, the method 600 may comprise sinking 604 a current at the output node 301 of the multi-stage amplifier 200 to a low potential 303 (e.g. to ground), by activating the second output stage 410, 411, 412, if the input voltage at the input node 255 is indicative of an overvoltage situation at the output node 301 (e.g. if the input voltage rises above a second threshold voltage). As a result of the sourcing and the sinking of current at the output node 301, the output voltage may be stabilized in a fast and power efficient manner.

In the present document, a robust AB control and sink/source output circuit for multi-stage amplifiers, such as LDOs, has been described. The described circuit may be operated in a sourcing mode and in a sinking mode. The sourcing mode and the sinking mode are separated by means of matching of transistors of the circuit and/or by means of operating point control. The described circuit may require a slightly increased current, however, the extra current may be kept small by using a staggered circuit approach. Furthermore, circuitry has been described which may be used to maintain the output stages "always on" (i.e. in an "awake" state) in order to ensure a fast reaction on load steps. The circuit allows the sink and source currents to be set independently as long as stability is maintained. Furthermore, main loop stability measures such as e.g. a Miller capacitor may be used for both modes of operation.

The described circuit may be used within a multi-stage amplifier which is able to source and sink a current while maintaining an output voltage at an output node at a defined level. Furthermore, the described circuit allows voltage ramping (DVC) requirements to be fulfilled. In addition, the load step behavior of the output voltage from e.g. a maximum current Imax to zero may be improved.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A multi-stage amplifier comprising
   a first amplification stage configured to activate or to deactivate a first output stage in response to an input voltage at an input node;
   the first output stage configured to source a current at an output node of the multi-stage amplifier from a high potential, when activated;
   a second amplification stage configured to activate or to deactivate a second output stage in response to the input voltage at the input node; and
   the second output stage configured to sink a current at the output node of the multi-stage amplifier to a low potential, when activated; wherein the first amplification stage and the second amplification stage are configured to activate the first output stage and the second output stage in a mutually exclusive manner, wherein
   the first amplification stage comprises
      a first current source configured to provide a first current; and
      a first input transistor arranged in series with the first current source; wherein a gate of the first input transistor is coupled to the input node; wherein the first amplification stage is configured to control a voltage level at a first midpoint between the first current source and the first input transistor, subject to the input voltage at the input node; wherein the first output stage is coupled to the first midpoint; and
   the second amplification stage comprises
      a second current source configured to provide a second current; and
   a second input transistor arranged in series with the second current source; wherein a gate of the second input transistor is coupled to the input node; wherein the second amplification stage is configured to control a voltage level at a second midpoint between the second current source and the second input transistor, subject to the input voltage at the input node; wherein the second output stage is coupled to the second midpoint.

2. The multi-stage amplifier of claim 1, wherein
   the first current source is coupled to the high potential;
   a drain of the first input transistor is coupled to the first midpoint; and
   a source of the first input transistor is coupled to the low potential.

3. The multi-stage amplifier of claim 1, wherein
   the second current source is coupled to the high potential;
   a drain of the second input transistor is coupled to the second midpoint; and
   a source of the second input transistor is coupled to the low potential.

4. The multi-stage amplifier of claim 1, wherein
   the second current source is coupled to the high potential;
   a drain of the second input transistor is coupled to the second midpoint; and
   a source of the second input transistor is coupled to the first midpoint.

5. The multi-stage amplifier of claim 1, wherein
   the first input transistor comprises a first partial transistor and a second partial transistor;

the first partial transistor and the second partial transistor are arranged in series;
a gate of the first partial transistor and a gate of the second partial transistor are coupled to the input node; and
a source of the second input transistor is coupled to a midpoint between the first partial transistor and the second partial transistor.

6. The multi-stage amplifier of claim 1, wherein
the first output stage comprises
   a first control transistor having a gate which is coupled to the first amplification stage, and being configured to vary a first control current through the first control transistor, subject to a voltage level at the gate of the first control transistor; and
   a first output amplifier configured to source an amplified version of the first control current to the output node; and
the second output stage comprises
   a second control transistor having a gate which is coupled to the second amplification stage, and being configured to vary a second control current through the second control transistor, subject to a voltage level at the gate of the second control transistor; and
   a second output amplifier configured to sink an amplified version of the second control current at the output node.

7. The multi-stage amplifier of claim 6, wherein
the first output stage comprises a first maintenance current source arranged in parallel to the first control transistor and configured to provide a first maintenance current to the first output amplifier; and/or
the second output stage comprises a second maintenance current source arranged in parallel to the second control transistor and configured to provide a second maintenance current to the second output amplifier.

8. The multi-stage amplifier of claim 6, wherein
the first output amplifier comprises a first current mirror with a first diode transistor and a first output transistor;
the first diode transistor is arranged in series with the first control transistor such that the first diode transistor is traversed by the first control current;
a drain of the first output transistor is coupled to the output node;
the first output transistor is traversed by the amplified version of the first control current, which is sourced at the output node;
the second output amplifier comprises a second current mirror with a second diode transistor and a second output transistor;
the second diode transistor is arranged in series with the second control transistor such that the second diode transistor is traversed by the second control current;
a drain of the second output transistor is coupled to the output node; and
the second output transistor is traversed by the amplified version of the second control current, which is sunk at the output node.

9. The multi-stage amplifier of claim 8, wherein
the first output transistor and the second output transistor are arranged in series;
the output node corresponds to a midpoint between the first output transistor and the second output transistor;
a source of the first output transistor is coupled to the high potential;
a source of the second output transistor is coupled to the low potential;
a source of the first diode transistor is coupled to the high potential;
a source of the first control transistor is coupled to the low potential;
a source of the second diode transistor is coupled to the low potential; and
a source of the second control transistor is coupled to the high potential.

10. The multi-stage amplifier of claim 6, wherein
the first control transistor comprises an N-type metaloxide semiconductor, referred to as MOS, transistor;
the first output amplifier comprises P-type MOS transistors;
the second control transistor comprises a P-type MOS transistor; and
the second output amplifier comprises N-type MOS transistors.

11. The multi-stage amplifier of claim 1, further comprising an auxiliary input transistor; wherein
a gate of the auxiliary input transistor is coupled to the input node;
a drain of the auxiliary input transistor is coupled to the output node; and
a source of the auxiliary input transistor is coupled to the low potential.

12. The multi-stage amplifier of claim 1, wherein
the first amplification stage is configured to activate the first output stage, if the input voltage is at or below a pre-determined first threshold voltage;
the second amplification stage is configured to activate the second output stage, if the input voltage is at or above a pre-determined second threshold voltage; and
the second threshold voltage is equal to or greater than the first threshold voltage.

13. The multi-stage amplifier of claim 1, further comprising
voltage sensing means configured to provide an indication of an output voltage at the output node; and
a differential amplification stage configured to provide the input voltage at the input node, based on a reference voltage and based on the indication of the output voltage at the output node.

14. A method for stabilizing an output voltage at an output node of a multi-stage amplifier, the method comprising
activating or deactivating a first output stage in response to an input voltage at an input node using a first amplification stage; wherein the input voltage at the input node is dependent on the output voltage at the output node;
activating or deactivating a second output stage in response to the input voltage at the input node using a second amplification stage; wherein the first amplification stage and the second amplification stage are activate the first output stage and the second output stage in a mutually exclusive manner;
sourcing a current at the output node of the multi-stage amplifier from a high potential, by activating the first output stage, if the input voltage at the input node is indicative of an undervoltage situation at the output node; and
sinking a current at the output node of the multi-stage amplifier to a low potential, by activating the second output stage, if the input voltage at the input node is indicative of an overvoltage situation at the output node, wherein
the first amplification stage comprises
   a first current source to provide a first current; and
   a first input transistor arranged in series with the first current source; wherein a gate of the first input transistor is coupled to the input node; wherein the first amplification stage is to control a voltage level at a first midpoint between the first current source and the first input transistor, subject to the input voltage at the input node; wherein the first output stage is coupled to the first midpoint; and the second amplification stage comprises
a second current source to provide a second current; and
a second input transistor arranged in series with the second current source; wherein a date of the second input transistor is coupled to the input node; wherein the second amplification stage is to control a voltage level at a second midpoint between the second current source and the second input transistor, subject to the input voltage at the input node; wherein the second output stage is coupled to the second midpoint.

15. The method for stabilizing an output voltage at an output node of a multi-stage amplifier of claim 14, wherein
the first current source is coupled to the high potential;
a drain of the first input transistor is coupled to the first midpoint; and
a source of the first input transistor is coupled to the low potential.

16. The method for stabilizing an output voltage at an output node of a multi-stage amplifier of claim 14, wherein
the second current source is coupled to the high potential;
a drain of the second input transistor is coupled to the second midpoint; and
a source of the second input transistor is coupled to the low potential.

17. The method for stabilizing an output voltage at an output node of a multi-stage amplifier of claim 14, wherein
the second current source is coupled to the high potential;
a drain of the second input transistor is coupled to the second midpoint; and
a source of the second input transistor is coupled to the first midpoint.

18. The method for stabilizing an output voltage at an output node of a multi-stage amplifier of claim 14, wherein
the first input transistor comprises a first partial transistor and a second partial transistor;
the first partial transistor and the second partial transistor are arranged in series;
a gate of the first partial transistor and a gate of the second partial transistor are coupled to the input node; and
a source of the second input transistor is coupled to a midpoint between the first partial transistor and the second partial transistor.

19. The method for stabilizing an output voltage at an output node of a multi-stage amplifier of claim 14, wherein
the first output stage comprises
a first control transistor having a gate which is coupled to the first amplification stage, and which varies a first control current through the first control transistor, subject to a voltage level at the gate of the first control transistor; and
a first output amplifier to source an amplified version of the first control current to the output node; and
the second output stage comprises
a second control transistor having a gate which is coupled to the second amplification stage, and which varies a second control current through the second control transistor, subject to a voltage level at the gate of the second control transistor; and
a second output amplifier to sink an amplified version of the second control current at the output node.

20. The method for stabilizing an output voltage at an output node of a multi-stage amplifier of claim 19, wherein
the first output stage comprises a first maintenance current source arranged in parallel to the first control transistor and to provide a first maintenance current to the first output amplifier; and/or
the second output stage comprises a second maintenance current source arranged in parallel to the second control transistor and to provide a second maintenance current to the second output amplifier.

21. The method for stabilizing an output voltage at an output node of a multi-stage amplifier of claim 19, wherein
the first output amplifier comprises a first current mirror with a first diode transistor and a first output transistor;
the first diode transistor is arranged in series with the first control transistor such that the first diode transistor is traversed by the first control current;
a drain of the first output transistor is coupled to the output node;
the first output transistor is traversed by the amplified version of the first control current, which is sourced at the output node;
the second output amplifier comprises a second current mirror with a second diode transistor and a second output transistor;
the second diode transistor is arranged in series with the second control transistor such that the second diode transistor is traversed by the second control current;
a drain of the second output transistor is coupled to the output node; and
the second output transistor is traversed by the amplified version of the second control current, which is sunk at the output node.

22. The method for stabilizing an output voltage at an output node of a multi-stage amplifier of claim 21, wherein
the first output transistor and the second output transistor are arranged in series;
the output node corresponds to a midpoint between the first output transistor and the second output transistor;
a source of the first output transistor is coupled to the high potential;
a source of the second output transistor is coupled to the low potential;
a source of the first diode transistor is coupled to the high potential;
a source of the first control transistor is coupled to the low potential;
a source of the second diode transistor is coupled to the low potential; and
a source of the second control transistor is coupled to the high potential.

23. The method for stabilizing an output voltage at an output node of a multi-stage amplifier of claim 19, wherein
the first control transistor comprises an N-type metaloxide semiconductor, referred to as MOS, transistor;
the first output amplifier comprises P-type MOS transistors;
the second control transistor comprises a P-type MOS transistor; and
the second output amplifier comprises N-type MOS transistors.

24. The method for stabilizing an output voltage at an output node of a multi-stage amplifier of claim 14, further comprising an auxiliary input transistor; wherein
a gate of the auxiliary input transistor is coupled to the input node;

a drain of the auxiliary input transistor is coupled to the output node; and a source of the auxiliary input transistor is coupled to the low potential.

25. The method for stabilizing an output voltage at an output node of a multi-stage amplifier of claim 14, wherein the first amplification stage is activates the first output stage, if the input voltage is at or below a pre-determined first threshold voltage;

the second amplification stage is activates the second output stage, if the input voltage is at or above a pre-determined second threshold voltage; and the second threshold voltage is equal to or greater than the first threshold voltage.

26. The method for stabilizing an output voltage at an output node of a multi-stage amplifier of claim 14, further comprising voltage sensing means to provide an indication of an output voltage at the output node; and a differential amplification stage to provide the input voltage at the input node, based on a reference voltage and based on the indication of the output voltage at the output node.

* * * * *